United States Patent
Schicktanz et al.

(10) Patent No.: US 9,502,316 B2
(45) Date of Patent: Nov. 22, 2016

(54) METHOD AND DEVICE FOR PRODUCING A PLURALITY OPTOELECTRONIC ELEMENTS

(71) Applicant: OSRAM OLED GmbH, Regensburg (DE)

(72) Inventors: Simon Schicktanz, Regensburg (DE); Daniel Steffen Setz, Boeblingen (DE)

(73) Assignee: OSRAM OLED GMBH, Regensburg (DE)

(*) Notice: Subject to any disclaimer, the term of this patent is extended or adjusted under 35 U.S.C. 154(b) by 141 days.

(21) Appl. No.: 14/398,474

(22) PCT Filed: Apr. 24, 2013

(86) PCT No.: PCT/EP2013/058499
§ 371 (c)(1),
(2) Date: Nov. 3, 2014

(87) PCT Pub. No.: WO2013/164231
PCT Pub. Date: Nov. 7, 2013

(65) Prior Publication Data
US 2015/0099313 A1 Apr. 9, 2015

(30) Foreign Application Priority Data
May 3, 2012 (GB) .................. 10 2012 207 324

(51) Int. Cl.
*H01L 21/66* (2006.01)
*H01L 29/06* (2006.01)
(Continued)

(52) U.S. Cl.
CPC .......... *H01L 22/20* (2013.01); *H01L 29/1606* (2013.01); *H01L 29/413* (2013.01);
(Continued)

(58) Field of Classification Search
CPC ................ H01L 2251/5361; H01L 2251/568; H01L 22/20; H01L 29/0665; H01L 29/1606; H01L 29/413; H01L 51/0031; H01L 51/50; H01L 51/5262; H01L 51/56

USPC ....... 438/14, 28–37, 69–71; 257/13, 76–103, 257/21, 184–189
See application file for complete search history.

(56) References Cited

U.S. PATENT DOCUMENTS 6,395,564 B1   5/2002  Huang
7,407,891 B2   8/2008  Bauer et al.
(Continued)

FOREIGN PATENT DOCUMENTS

DE   102004054566 A1   5/2006
DE   102009003544 A1   9/2010
(Continued)

OTHER PUBLICATIONS

International Search Report of PCT/EP2013/058499 dated Aug. 20, 2013.

*Primary Examiner* — H Tsai
(74) *Attorney, Agent, or Firm* — Viering, Jentschura & Partner mbB

(57) ABSTRACT

A method for producing a plurality of optoelectronic components may include measuring at least one measurement parameter for a first optoelectronic component and a second optoelectronic component, and processing the first optoelectronic component and the second optoelectronic component taking account of the measured measurement parameter value of the first optoelectronic component and the measured measurement parameter value of the second optoelectronic component, such that the optoelectronic properties of the first optoelectronic component and the optoelectronic properties of the second optoelectronic component are changed in a different way toward at least one common predefined optoelectronic target property. The processing of at least one value of a measurement parameter of the optoelectronic properties of the first optoelectronic component or of the optoelectronic properties of the second optoelectronic component toward the optoelectronic target property is formed by means of a compensation element. The compensation element is formed as a film.

15 Claims, 8 Drawing Sheets

(51) Int. Cl.
  *H01L 51/00*  (2006.01)
  *H01L 51/52*  (2006.01)
  *H01L 51/56*  (2006.01)
  *H01L 29/16*  (2006.01)
  *H01L 29/41*  (2006.01)
  *H01L 51/50*  (2006.01)
(52) U.S. Cl.
  CPC ....... *H01L51/0031* (2013.01); *H01L 51/5262* (2013.01); *H01L 51/56* (2013.01); *H01L 29/0665* (2013.01); *H01L 51/50* (2013.01); *H01L 2251/5361* (2013.01); *H01L 2251/568* (2013.01)

(56) References Cited

U.S. PATENT DOCUMENTS

| | | | |
|---|---|---|---|
| 8,699,038 | B2 | 4/2014 | Schoenleber et al. |
| 2002/0171911 | A1 | 11/2002 | Maegawa |
| 2011/0217794 | A1 | 9/2011 | Tetz et al. |
| 2013/0209025 | A1* | 8/2013 | Levy .................. G02B 6/4214 385/14 |

FOREIGN PATENT DOCUMENTS

| | | |
|---|---|---|
| DE | 102011001238 A1 | 9/2011 |
| JP | 2009164025 A | 7/2009 |

* cited by examiner

METHOD AND DEVICE FOR PRODUCING A PLURALITY OPTOELECTRONIC ELEMENTS

RELATED APPLICATIONS

The present application is a national stage entry according to 35 U.S.C. §371 of PCT application No.: PCT/EP2013/058499 filed on Apr. 24, 2013, which claims priority from German application No.: 10 2012 207 324.8 filed on May 3, 2012, and is incorporated herein by reference in its entirety.

TECHNICAL FIELD

In various embodiments, a method and a device for producing a plurality of optoelectronic components are provided.

BACKGROUND

In the production of optoelectronic components, for example organic light-emitting diodes (OLEDs), fluctuations in the layer thickness and doping can occur locally. This can lead to deviations in the color, the brightness, the efficiency and the viewing angle dependence of optoelectronic components among one another. The fluctuations can be a natural manufacturing variation, which are dependent on the position of the optoelectronic component on the system carrier prior to singulation and on process fluctuations during production as a result of deviations of the process systems from the calibration.

Optoelectronic components having identical optoelectronic properties are designated here as a bin. The properties striven for in the process can be designated as a target bin or target properties.

In order to produce a specific number of optoelectronic components having a desired target property, for example a specific color, significantly more components than are required would therefore have to be produced, i.e. the natural manufacturing fluctuation is compensated for by uneconomic overproduction.

One conventional method for changing the brightness or the color of light-emitting optoelectronic components is applying a film to improve the coupling-out of light, a so-called compensation film. In this case, a film type is applied to the light-emitting optoelectronic components independently of the actual, individual optoelectronic properties of an optoelectronic component. In this case, the compensation film may include, for example, a scattering layer and/or a layer having a high refractive index.

SUMMARY

In various embodiments, a method and a device for producing a plurality of optoelectronic components are provided with which it is possible to adapt optoelectronic components having different optoelectronic properties toward a common target property.

In the context of this description, an organic substance can be understood to mean a carbon compound which, regardless of the respective state of matter, is present in chemically uniform form and is characterized by characteristic physical and chemical properties. Furthermore, in the context of this description, an inorganic substance can be understood to mean a compound which, regardless of the respective state of matter, is present in chemically uniform form and is characterized by characteristic physical and chemical properties, without carbon or a simple carbon compound. In the context of this description, an organic-inorganic substance (hybrid substance) can be understood to mean a compound which, regardless of the respective state of matter, is present in chemically uniform form and is characterized by characteristic physical and chemical properties, including compound portions which contain carbon and are free of carbon. In the context of this description, the term "substance" encompasses all abovementioned substances, for example an organic substance, an inorganic substance, and/or a hybrid substance. Furthermore, in the context of this description, a substance mixture can be understood to mean something which has constituents consisting of two or more different substances, the constituents of which are very finely dispersed, for example. A substance class should be understood to mean a substance or a substance mixture including one or more organic substance(s), one or more inorganic substance(s) or one or more hybrid substance(s). The term "material" can be used synonymously with the term "substance".

In various embodiments, a method for producing a plurality of optoelectronic components is provided, the method including: measuring at least one measurement parameter for a first optoelectronic component and a second optoelectronic component and processing the first optoelectronic component and the second optoelectronic component taking account of the measured measurement parameter value of the first optoelectronic component and the measured measurement parameter value of the second optoelectronic component, such that the optoelectronic properties of the first optoelectronic component and the optoelectronic properties of the second optoelectronic component are changed in a different way toward at least one common predefined optoelectronic target property.

Optoelectronic properties can be, with regard to emitted or absorbed electromagnetic radiation, for example, the intensity (brightness), the wavelength spectrum (color), the viewing angle dependence, the absorption or the efficiency of an optoelectronic component.

The target properties can be the component properties planned with the intended layer cross section, wherein natural manufacturing fluctuations form deviations of the optoelectronic properties from the target properties (initial states).

However, the target property can also be an individually different adjustable target property, i.e. the specific layer cross section of the optoelectronic components can be a starting point for the optoelectronic properties adjustable according to a specific desire of a customer.

The target property includes a plurality of defined parameters having a respectively permissible variance, for example the wavelength of emitted electromagnetic radiation with maximum intensity is intended to be formed at 540 nm±10 nm.

An adaptation or a compensation of the initial state can be dispensed with if the initial state corresponds to the target state.

The number of possible initial states and processing possibilities or adaptations is not limited. Rather, initial states and adaptations can differ discretely or even infinitesimally among one another and from one another.

The optoelectronic components having different optoelectronic properties can have an identical or different design. An identical design can be understood to mean a planned layer cross section of the component, i.e. identical number of layers, identical thickness of the layers and identical sequence of the layers.

By means of natural manufacturing fluctuation, however, in the case of an identical design, deviations of the optoelectronic properties of the optoelectronic components among one another can occur, for example in terms of deviations of the thicknesses of individual layers for example in a range of approximately 0% to approximately 10%, for example in terms of the doping of semiconducting doped layers in a range of approximately 0% to approximately 10%.

In one configuration, the first optoelectronic component and the second optoelectronic component can have a common system carrier or a plurality of different system carriers in the process of measuring the at least one measurement parameter.

In one configuration, the optoelectronic properties of the first optoelectronic component and of the second optoelectronic component can be formed by means of at least one measurable parameter. In this case, measurable parameters should be understood as non-invasively determinable, for example by means of applying an electric current or measuring the intensity of absorbed or emitted electromagnetic radiation and without creating an irreversible cross-sectional view of the component for example in manufacturing.

In another configuration, the measurable parameter may include a measurement parameter with regard to emitted or absorbed electromagnetic radiation from the group of the measurement parameters: the brightness or the intensity; the wavelength spectrum or the color; the viewing angle dependence; the absorption or the efficiency. The absorption of electromagnetic radiation can be of importance for example in the case of photovoltaic components (solar cells) and/or detectors for electromagnetic radiation for the protection of the detectors, for example in the case of high-energy radiation, for example X-ray radiation.

In another configuration, the optoelectronic properties of the first optoelectronic component and the optoelectronic properties of the second optoelectronic component can deviate from the optoelectronic target property in terms of the same optoelectronic property.

In another configuration, the deviation of the optoelectronic property of the first optoelectronic component and of the second optoelectronic component from the target property can be formed in a different absolute value of the measurement parameter value.

In another configuration, the optoelectronic properties of the first optoelectronic component and the optoelectronic properties of the second optoelectronic component can deviate from the optoelectronic target property in terms of different optoelectronic properties or different measurement parameter values.

In another configuration, measuring the measurement parameter may include measuring the optoelectronic properties after or during the manufacture of the optoelectronic component.

Measuring can be carried out for example after applying the second electrode and/or after applying the encapsulation and/or after applying the protective lacquer and/or after applying the glass cover.

Measuring can involve determining an individual measurement parameter or a plurality of measurement parameters simultaneously or successively, for example the wavelength spectrum of emitted electromagnetic radiation (color) and the brightness, for example by means of a photodetector after an operating voltage has been applied to the component.

Identical or different measurement parameters can be measured multiply or after different manufacturing steps, for example measuring the color after applying the encapsulation and after applying the protective lacquer; for example measuring the color after applying the encapsulation and measuring the brightness after applying the glass cover.

After the process of measuring the optoelectronic properties of the optoelectronic components, on the basis of the specific layer cross section of the optoelectronic component the specific adaptation measures can be determined and the optoelectronic components can be set to the common target property.

Selecting specific adaptation measures can be formed by means of connecting the measuring unit(s) to a selection unit, which includes a process matrix, automatically, for example electronically, for example in a computer-aided manner.

The selected adaptation measure processes the optoelectronic component in such a way that the deviation with respect to the target properties is the least, relative to the non-selected alternative adaptation measures. In this case, one from at least two adaptation measures is selected. The selection criterion can be based on experimental experience and take account of economic aspects.

In another configuration, the processing of at least one value of a measurement parameter of the optoelectronic properties of the first optoelectronic component or of the optoelectronic properties of the second optoelectronic component toward the optoelectronic target property can be formed by means of a compensation measure.

In this case, a compensation measure can be a compensation element or a compensation process. The compensation measures may include applying a substance or substance mixture to the component or removing a part of the component, for example homogeneously reducing the layer thickness or roughening or smoothing the exposed surface of the component.

Identical compensation measures can have different effects on the optoelectronic properties in the case of similar optoelectronic components on account of nonlinear optical relationships, for example in the vicinity of the conditions of optical interference and/or total internal reflection.

Depending on the specific configuration of the layer thicknesses of the components of identical design, minimal differences in the optical thickness can occur, for example by a few 10 nm. As a result, in some components, the formation of destructive interference at the interface that couples out radiation can occur. In some components, the adaptation measure can then have no significant influence on the color or brightness of one component and, in another component of identical design, can lead to extinction of a wavelength in the emission spectrum of the optoelectronic component.

In one configuration, the compensation element can be formed as a coating or compensating coating or compensation coating.

In another configuration, the compensation element can be formed as a film or compensating film or compensation film.

In another configuration, the film may include at least one coating. In this case, the coating on the film can be a compensating coating and the film can be a carrier of the coating. However, the film and the coating can also have a mutually complementary optoelectronic effect or different optoelectronic effects.

In another configuration, the compensation process or the compensating process can be a process selected from the group of the following processes: smoothing, roughening, reducing the layer thickness, polymerizing, or structuring.

In another configuration, two or more compensation elements or compensation processes can be applied to the first optoelectronic component or two or more compensation elements or compensation processes can be applied to the second optoelectronic component.

In another configuration, the two or more compensation elements can process, i.e. improve, different parameters of the first optoelectronic component or of the second optoelectronic component toward the target properties.

Improving an optoelectronic property can be understood to mean approximating the optoelectronic properties to the target property, for example changing the color or color mixture, i.e. the wavelength spectrum, of the emitted light of the component toward the target property, for example from green light to white light. Changing the color can be formed for example by means of wavelength conversion, for example by means of a layer including phosphor with Stokes shift; or by means of increasing the proportion of coupled-out light with the target property by means of changing wavelength-dependent conditions of interference or total internal reflection by means of applying a layer composed of high refractive index glass.

In another configuration, compensation measures embodied differently can be combined with one another in order to process the value of at least one measurement parameter of the optoelectronic properties of the first optoelectronic component or of the optoelectronic properties of the second optoelectronic component toward the optoelectronic target property. Combination of compensation measures embodied differently should be understood to mean, for example, the combination of compensation process and compensation coating, for example roughening the surfaces of the component can form scattering centers to which a coating for reducing the total internal reflection is applied.

In another configuration, the value of two or more measurement parameters can be changed simultaneously by means of one compensation element.

In another configuration, the change of a value of a measurement parameter of a previous compensation element can be compensated for by means of a compensation element. A compensation may be necessary, for example, if a compensation element changes the color of emitted electromagnetic radiation, but in the process simultaneously reduces the intensity or brightness because less light is coupled out. Applying a further compensation element can then increase the proportion of light coupling out, i.e. the intensity or brightness of the radiation or light emitted by the component, without influencing the color of the emitted radiation, for example by means of a scattering layer or changing the conditions for total internal reflection, for example by means of a layer having a higher refractive index; and/or the conditions for interference, for example by means of increasing the optical thickness of the component by a few 10 nm.

In another configuration, the two or more compensation elements may include layers having an identical or different layer cross section, wherein a layer cross section includes the following properties: the layer sequence, the number of layers, the layer thickness, the substance composition of the layers. The roughness of an internal interface, for example with air inclusions, can have a scattering effect, for example, in the case of an identical substance composition of successively applied layers.

In another configuration, the two or more compensation processes may include identical or different processes with identical or different process parameters from the group of the following process parameters: temperature, substance composition of the atmosphere, plasma power or gas pressure, or similar conventional process parameters.

In another configuration, the optoelectronic properties of the first optoelectronic component or of the second optoelectronic component can process in combination from two or more compensation elements toward the target property.

In another configuration, at least one different compensation element can be applied to the first optoelectronic component in comparison with the second optoelectronic component. The different compensation element may include a different layer cross section in the case of identical formation of the compensation measure or include a different formation of the compensation measure.

The adaptation measures specific to the respective optoelectronic properties are dependent on the specific configuration of the optoelectronic component, for example the refractive indices of the substances used or the thickness of individual layers, for example the optical thickness of the individual layers, and the absorption in the individual layers.

In another configuration, the first optoelectronic component and the second optoelectronic component can have a common system carrier during the process of processing the optoelectronic properties toward the predefined optoelectronic target properties.

In another configuration, the first optoelectronic component and the second optoelectronic component can have different system carriers, i.e. can be singulated, during processing toward the predefined optoelectronic target property.

The substrate or the system carrier can be formed mechanically flexibly, for example as a film composed of plastic, aluminum, copper or steel, for example for roll-to-roll methods; or can be formed mechanically stiffly, for example as a wafer composed of glass, plastic or silicon.

In another configuration, processing the optoelectronic properties of an optoelectronic component can be formed during or after the manufacture of the optoelectronic component.

For applying adaptation elements, in accordance with the process matrix it is possible to provide the substances necessary for the adaptations, for example compensation films, for example different film classes, for example with different coatings.

In another configuration, processing the optoelectronic properties of the first optoelectronic component and of the second optoelectronic component toward the target properties can be formed simultaneously or successively in the case of the optoelectronic components.

In another configuration, the point in time of processing the optoelectronic properties can be dependent on the constitution of the compensation measure, for example if two adjacent components share a common system carrier, i.e. are not singulated.

In another configuration, further optical layers can be formed between the optoelectronic component and the compensation element. The further layers can have an adhesion-reinforcing, diffusion-inhibiting and/or optically coupling effect.

Compensating or processing the optoelectronic properties to the target property can be part of the front-end or back-end production of the optoelectronic component.

In another configuration, the optoelectronic component can be formed as a radiation-emitting component.

In another configuration, the radiation-emitting optoelectronic component can be formed as an organic light-emitting diode.

In another configuration, the optoelectronic component can be formed as a radiation-detecting component.

In another configuration, the radiation-detecting optoelectronic component can be formed as a detector for electromagnetic radiation, for example X-ray radiation, ultraviolet radiation, infrared radiation.

In various embodiments, a device is provided, the device including: an input unit, designed for inputting at least one common optoelectronic target property of the plurality of optoelectronic components; a measuring unit, designed for measuring at least one optoelectronic property of the optoelectronic components and for communicating the same to a selection unit; a compensation unit, designed for providing at least two compensation elements and/or compensation processes having different optoelectronic effects with regard to the common target property for the optoelectronic components for selection by means of a selection unit; the selection unit, designed for component-individually selecting at least one compensation element and/or at least one compensation method using the measured at least one optoelectronic properties of the optoelectronic components and the optoelectronic effect for the optoelectronic components in such a way that after the use of the at least one selected compensation element and/or of the at least one selected compensation method, the optoelectronic properties of the optoelectronic components are changed toward the target property.

In one configuration of the device, the input unit can be designed for inputting the manufacturing status of the optoelectronic components.

The target property and the manufacturing status can be communicated to the selection unit by means of information transport.

In another configuration of the device, the measuring unit can be designed for measuring a plurality of different measurement parameters simultaneously or successively.

In one configuration of the device, the compensation element can be designed as a coating, a film and/or a coated film.

In one configuration of the device, the compensation process can be designed as a process from the group of the following processes: smoothing; roughening; reducing the layer thickness; polymerizing; degrading or structuring.

In another configuration, the optoelectronic components, after processing by means of the selected compensation elements and/or compensation methods, can have a smaller deviation with respect to the common optoelectronic target property relative to the non-selected compensation elements and/or compensation methods.

In another configuration, the target property can be communicated as a spectrum into the input unit. Selecting a compensation process and/or compensation element can be carried out for example by means of coordinating the measured spectrum with the target spectrum, wherein the difference between the spectra is compared with the optoelectronic effect of known compensation measures.

A plurality of optoelectronic components can be transported into the device by means of a transport device after or during the manufacture of the optoelectronic components.

The transport of the components can be formed on a system carrier or after singulation.

In another configuration, the transport of the optoelectronic components in the device can be designed by means of a gripping unit (and/or a conveyor belt).

In another configuration, the compensation unit can be designed for performing at least one of the tasks from the group of the following tasks: singulating the optoelectronic components; labeling the optoelectronic components with compensation element to be applied and/or compensation process to be carried out; identifying the optoelectronic components; sorting the optoelectronic components according to the compensation processes and compensation elements; carrying out the compensation processes; or applying the compensation elements.

In the compensation unit, the components can firstly be singulated in a singulation unit, if the components have a common system carrier and singulation is necessary for performing the compensation measures.

Singulation may be necessary, for example, if multi-stage adaptation measures are intended to be formed for some components and not for other components.

A further reason for singulating the components may be incompatible compensation measures, for example applying an adhesive layer and subsequently applying a compensation film as a multi-stage compensation measure may be incompatible, for example, with simultaneously applying a scattering layer, and therefore separately processing and singulating the components.

Compensating may furthermore include singulating the components if optoelectronic components have optoelectronic properties which already correspond to the target properties and, consequently, no compensation measure are necessary.

Furthermore, the selection unit can determine whether the components should be singulated and/or form logical groups, i.e. for which components identical or similar compensation measures are formed and can therefore be processed together.

However, the singulation unit can be optional, for example since components have already been singulated before being transported into the device or singulation of the components is not possible or not provided, for example in the case of a plurality of planar and/or coupled optoelectronic components, for example with a film as common system carrier in roll-to-roll methods.

In the singulation unit, the components can be marked with their individual compensation measures, for example electronically, for example in an information memory within the compensation unit on the basis of their position on the system carrier or optically by means of a laser, for example by means of barcodes, on an edge region of the component which does not fulfill an optoelectronic task.

From the singulation unit or from the measuring unit, the optoelectronic components can be transported into the identification-sorting unit.

Without a singulation unit or singulation, it is possible to form the information flow and the transport of the components directly from the measuring unit into the identification-sorting unit. Furthermore, without a singulation unit, it is possible to form the individual marking of the components with their compensation measures in the identification-sorting unit.

In the identification-sorting unit, singulated components can be identified by means of their markings and transported to the compensation units in accordance with their compensation measures. If the optoelectronic properties already correspond to the target bin, the component can be transported from the device, i.e. the compensation measures are concluded.

For non-singulated components, the identification-sorting unit can set, i.e. trigger, the beginning of compensation measures for a component.

In another configuration, the compensation unit may include one or a plurality of different compensation installations.

One compensation installation can be a unit for applying compensation layers, for example adhesive layer, scattering layer, coupling layer, waveguide layer, for example a chemical and/or physical vapor deposition installation (chemical vapor deposition, physical vapor deposition, sputtering), a spray coater (spray coating), a dip coater (dip coating), a spin coater (spin coating), a squeegee (screen printing) or similar, conventional method installations.

In the compensation installation for compensation layers, depending on the individual optoelectronic properties of the components in accordance with the selection unit it is possible to set individual coating methods and/or substances and/or substance mixtures and/or process parameters, for example temperature, air humidity, pressure, solvents, solution concentration, layer thicknesses, drying times, or similar, conventional parameters.

Another compensation installation can be formed as a unit for applying a compensation film, for example a film for increasing the optical thickness of the optoelectronic component, a film having a scattering effect, a film having a wavelength-converting effect, for example by means of lamination.

Another compensation installation can be a unit for a compensation process, for example smoothing, for example chemical mechanical polishing; etching, for example wet-chemically by means of acids or physically by means of plasma, structuring, doping, plasma treatment of the exposed surface of the component, polymerizing, degrading or similar, conventional methods for the treatment of surface properties.

In one configuration, the device can be part of a conventional manufacturing installation for optoelectronic components and the thickness of the adhesive layer and/or the constitution of the cover glass and/or the surface roughness of, for example, the thin-film encapsulation or second electrode can be set by means of the device.

The incipiently roughened surface of the thin-film encapsulation or of the second electrode can act as a scattering layer and simultaneously act for increasing the adhesion of the adhesive layer. The adhesive layer and the cover glass, depending on their specific thickness, by means of increasing the optical thickness of the component, can shift interference conditions and thus change the color and/or brightness. For a specific configuration of a component, the device can adapt values, for example the layer thickness of the adhesive layer, the process condition thereof and the surface roughness of the thin-film encapsulation or second electrode, dynamically to the specific component in order to optimize the optoelectronic properties.

The compensation installations may include individual installations, for example an individual vapor deposition installation, or a series of installations, for example when laminating films, including an installation for applying adhesive and an installation for applying lamination film.

The device may include a further transport device for the components from the compensation units.

The components can be transported from the device if the optoelectronic properties of the components correspond to the target bin, for example in order to apply the encapsulation or for example into back-end manufacturing.

However, the optoelectronic components can also pass through the device again, for example in order to set further optoelectronic properties, for example the brightness after the color has been set. For this purpose, a plurality of devices can be disposed in series or the target bin and/or the manufacturing status of the components can be changed manually or by means of a machine program in the input unit. The transport from the device can then be transport to a measuring unit.

Further reasons for the components to pass through the device again after leaving the compensation installations may include checking the optoelectronic properties, i.e. the compensation measures can be verified.

In the case of multi-stage compensation measures, passing through again can involve carrying out further compensation measures after the conclusion of the previous measure. In the case of passing through the device in a multi-stage process, i.e. if the multi-stage compensation measure are not formed in one compensation installation, an information flow to the identification-sorting unit from the compensation installations and/or an information memory in the identification-sorting unit may be necessary, which updates the status of the compensation measure and coordinates the next compensation measures.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the following detailed description, reference is made to the accompanying drawings, which form part of this description and show for illustration purposes specific embodiments in which the disclosure can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present disclosure. It goes without saying that the features of the various embodiments described herein can be combined with one another, unless specifically indicated otherwise. Therefore, the following detailed description should not be interpreted in a restrictive sense, and the scope of protection of the present disclosure is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In the context of this description, optoelectronic components having identical optoelectronic properties can be designated as a bin. In the context of this description, the properties striven for in the process can be designated as a target bin or target properties.

Figure 1:
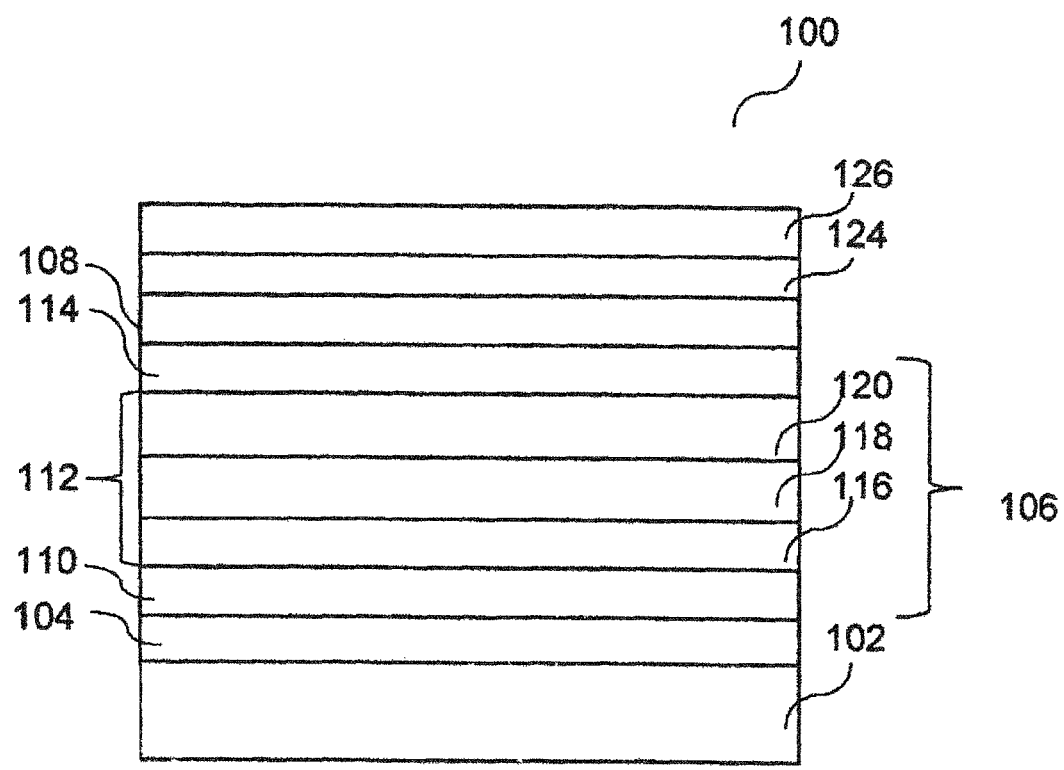
FIG. 1 shows a schematic cross-sectional view of an optoelectronic component, in accordance with various embodiments.

FIG. 1 shows a schematic cross-sectional view of an optoelectronic component, in accordance with various embodiments.

The light-emitting component 100 in the form of an organic light-emitting diode 100 can have a substrate 102. The substrate 102 can serve for example as a carrier element for electronic elements or layers, for example light-emitting elements. By way of example, the substrate 102 may include or be formed from glass, quartz, and/or a semiconductor material or any other suitable material. Furthermore, the substrate 102 may include or be formed from a plastic film or a laminate including one or including a plurality of plastic films. The plastic may include or be formed from one or more polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyethersulfone (PES) and/or polyethylene naphthalate (PEN). The substrate 102 may include one or more of the materials mentioned above. The substrate 102 can be embodied as translucent or even transparent.

In various embodiments, the term "translucent" or "translucent layer" can be understood to mean that a layer is transmissive to light, for example to the light generated by the light-emitting component, for example in one or more wavelength ranges, for example to light in a wavelength range of visible light (for example at least in a partial range of the wavelength range of from 380 nm to 780 nm). By way of example, in various embodiments, the term "translucent layer" should be understood to mean that substantially the entire quantity of light coupled into a structure (for example a layer) is also coupled out from the structure (for example layer), wherein part of the light can be scattered in this case.

In various embodiments, the term "transparent" or "transparent layer" can be understood to mean that a layer is transmissive to light (for example at least in a partial range of the wavelength range of from 380 nm to 780 nm), wherein light coupled into a structure (for example a layer) is also coupled out from the structure (for example layer) substantially without scattering or light conversion. Consequently, in various embodiments, "transparent" should be regarded as a special case of "translucent".

For the case where, for example, a light-emitting monochromatic or emission spectrum-limited electronic component is intended to be provided, it suffices for the optically translucent layer structure to be translucent at least in a partial range of the wavelength range of the desired monochromatic light or for the limited emission spectrum.

In various embodiments, the organic light-emitting diode 100 (or else the light-emitting components in accordance with the embodiments that have been described above or will be described below) can be designed as a so-called top and bottom emitter. A top and bottom emitter can also be designated as an optically transparent component, for example a transparent organic light-emitting diode.

In various embodiments, a barrier layer 104 can optionally be arranged on or above the substrate 102.

The barrier layer 104 may include or consist of one or more of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. Furthermore, in various embodiments, the barrier layer 104 can have a layer thickness in a range of approximately 0.1 nm (one atomic layer) to approximately 5000 nm, for example a layer thickness in a range of approximately 10 nm to approximately 200 nm, for example a layer thickness of approximately 40 nm.

An electrically active region 106 of the light-emitting component 100 can be arranged on or above the barrier layer 104. The electrically active region 106 can be understood as the region of the light-emitting component 100 wherein an electric current flows for the operation of the light-emitting component 100. In various embodiments, the electrically active region 106 may include a first electrode 110, a second electrode 114 and an organic functional layer structure 112, as will be explained in even greater detail below.

In this regard, in various embodiments, the first electrode 110 (for example in the form of a first electrode layer 110) can be applied on or above the barrier layer 104 (or, if the barrier layer 104 is not present, on or above the substrate 102). The first electrode 110 (also designated hereinafter as bottom electrode 110) can be formed from an electrically conductive material, such as, for example, a metal or a transparent conductive oxide (TCO) or a layer stack including a plurality of layers of the same metal or different metals and/or the same TCO or different TCOs. Transparent conductive oxides are transparent conductive materials, for example metal oxides, such as, for example, zinc oxide, tin oxide, cadmium oxide, titanium oxide, indium oxide, or indium tin oxide (ITO). Alongside binary metal-oxygen compounds, such as, for example, ZnO, $SnO_2$, or $In_2O_3$, ternary metal-oxygen compounds, such as, for example, AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs and can be used in various embodiments. Furthermore, the TCOs do not necessarily correspond to a stoichiometric composition and can furthermore be p-doped or n-doped.

In various embodiments, the first electrode 110 may include a metal; for example Ag, Pt, Au, Mg, Al, Ba, In, Ag, Au, Mg, Ca, Sm or Li, and compounds, combinations or alloys of these materials.

In various embodiments, the first electrode 110 can be formed by a layer stack of a combination of a layer of a metal on a layer of a TCO, or vice versa. One example is a silver layer applied on an indium tin oxide layer (ITO) (Ag on ITO) or ITO—Ag—ITO multilayers.

In various embodiments, the first electrode 110 can provide one or a plurality of the following materials as an alternative or in addition to the abovementioned materials: networks composed of metallic nanowires and nanoparticles, for example composed of Ag; networks composed of carbon nanotubes; graphene particles and graphene layers; networks composed of semiconducting nanowires.

Furthermore, the first electrode 110 may include electrically conductive polymers or transition metal oxides or transparent electrically conductive oxides.

In various embodiments, the first electrode 110 and the substrate 102 can be formed as translucent or transparent. In the case where the first electrode 110 is formed from a metal, the first electrode 110 can have for example a layer thickness of less than or equal to approximately 25 nm, for example a layer thickness of less than or equal to approximately 20 nm, for example a layer thickness of less than or equal to approximately 18 nm. Furthermore, the first electrode 110 can have for example a layer thickness of greater than or equal to approximately 10 nm, for example a layer thickness of greater than or equal to approximately 15 nm. In various embodiments, the first electrode 110 can have a layer thickness in a range of approximately 10 nm to approximately 25 nm, for example a layer thickness in a range of approximately 10 nm to approximately 18 nm, for example a layer thickness in a range of approximately 15 nm to approximately 18 nm.

Furthermore, for the case where the first electrode 110 is formed from a transparent conductive oxide (TCO), the first electrode 110 can have for example a layer thickness in a range of approximately 50 nm to approximately 500 nm, for example a layer thickness in a range of approximately 75 nm to approximately 250 nm, for example a layer thickness in a range of approximately 100 nm to approximately 150 nm.

Furthermore, for the case where the first electrode 110 is formed from, for example, a network composed of metallic nanowires, for example composed of Ag, which can be combined with conductive polymers, a network composed of carbon nanotubes which can be combined with conductive polymers, or from graphene layers and composites, the first electrode 110 can have for example a layer thickness in a range of approximately 1 nm to approximately 500 nm, for example a layer thickness in a range of approximately 10 nm to approximately 400 nm, for example a layer thickness in a range of approximately 40 nm to approximately 250 nm.

The first electrode 110 can be formed as an anode, that is to say as a hole-injecting electrode, or as a cathode, that is to say as an electron-injecting electrode.

The first electrode 110 can have a first electrical terminal, to which a first electrical potential (provided by an energy source (not illustrated), for example a current source or a voltage source) can be applied. Alternatively, the first electrical potential can be applied to the substrate 102 and then be fed indirectly to the first electrode 110 via said substrate. The first electrical potential can be, for example, the ground potential or some other predefined reference potential.

Furthermore, the electrically active region 106 of the light-emitting component 100 can have an organic electroluminescent layer structure 112, which is applied on or above the first electrode 110.

The organic electroluminescent layer structure 112 may include one or a plurality of emitter layers 118, for example including fluorescent and/or phosphorescent emitters, and one or a plurality of hole-conducting layers 116 (also designated as hole transport layer(s) 120). In various embodiments, one or a plurality of electron-conducting layers 116 (also designated as electron transport layer(s) 116) can alternatively or additionally be provided.

Examples of emitter materials which can be used in the light-emitting component 100 in accordance with various embodiments for the emitter layer(s) 118 include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl) iridium III), green phosphorescent Ir(ppy)$_3$ (tris(2-phenylpyridine)iridium III), red phosphorescent Ru (dtb-bpy)$_3$*2(PF$_6$) (tris[4,4'-di-tert-butyl(2,2')-bipyridine]ruthenium(III) complex) and blue fluorescent DPAVBi (4,4-bis[4-(di-p-tolylamino)styryl]biphenyl), green fluorescent TTPA (9,10-bis[N,N-di(p-tolyl)amino]anthracene) and red fluorescent DCM2 (4-dicyanomethylene)-2-methyl-6-julolidyl-9-enyl-4H-pyran) as non-polymeric emitters. Such non-polymeric emitters can be deposited by means of thermal evaporation, for example. Furthermore, it is possible to use polymer emitters, which can be deposited, in particular, by means of a wet-chemical method such as spin coating, for example.

The emitter materials can be embedded in a matrix material in a suitable manner.

It should be pointed out that other suitable emitter materials are likewise provided in other embodiments.

The emitter materials of the emitter layer(s) 118 of the light-emitting component 100 can be selected for example such that the light-emitting component 100 emits white light. The emitter layer(s) 118 may include a plurality of emitter materials that emit in different colors (for example blue and yellow or blue, green and red); alternatively, the emitter layer(s) 118 can also be constructed from a plurality of partial layers, such as a blue fluorescent emitter layer 118 or blue phosphorescent emitter layer 118, a green phosphorescent emitter layer 118 and a red phosphorescent emitter layer 118. By mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary and secondary radiation.

The organic electroluminescent layer structure 112 can generally include one or a plurality of electroluminescent layers. The one or the plurality of electroluminescent layers may include organic polymers, organic oligomers, organic monomers, organic small, non-polymeric molecules ("small molecules") or a combination of these materials. By way of example, the organic electroluminescent layer structure 112 may include one or a plurality of electroluminescent layers embodied as a hole transport layer 120, so as to enable for example in the case of an OLED an effective hole injection into an electroluminescent layer or an electroluminescent region. Alternatively, in various embodiments, the organic electroluminescent layer structure 112 may include one or a plurality of functional layers embodied as an electron transport layer 116, so as to enable for example in an OLED an effective electron injection into an electroluminescent layer or an electroluminescent region. By way of example, tertiary amines, carbazo derivatives, conductive polyaniline or polyethylene dioxythiophene can be used as material for the hole transport layer 120. In various embodiments, the one or the plurality of electroluminescent layers can be embodied as an electroluminescent layer.

In various embodiments, the hole transport layer 120 can be applied, for example deposited, on or above the first electrode 110, and the emitter layer 118 can be applied, for example deposited, on or above the hole transport layer 120.

In various embodiments, electron transport layer 116 can be applied, for example deposited, on or above the emitter layer 118.

In various embodiments, the organic electroluminescent layer structure 112 (that is to say for example the sum of the thicknesses of hole transport layer(s) 120 and emitter layer(s) 118 and electron transport layer(s) 116) can have a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic electroluminescent layer structure 112 can have for example a stack of a plurality of organic light-emitting diodes (OLEDs) arranged directly one above another, wherein each OLED can have for example a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic electroluminescent layer structure 112 can have for example a stack of two, three or four OLEDs arranged directly one above another, in which case for example the organic electroluminescent layer structure 112 can have a layer thickness of a maximum of approximately 3 µm.

The light-emitting component 100 can optionally generally include further organic functional layers, for example arranged on or above the one or the plurality of emitter layers 118 or on or above the electron transport layer(s) 116, which serve to further improve the functionality and thus the efficiency of the light-emitting component 100.

The second electrode 114 (for example in the form of a second electrode layer 114) can be applied on or above the organic electroluminescent layer structure 110 or, if appropriate, on or above the one or the plurality of further organic functional layers.

In various embodiments, the second electrode 114 may include or be formed from the same materials as the first electrode 110, metals being particularly suitable in various embodiments.

In various embodiments, the second electrode 114 (for example for the case of a metallic second electrode 114) can have for example a layer thickness of less than or equal to approximately 50 nm, for example a layer thickness of less than or equal to approximately 45 nm, for example a layer thickness of less than or equal to approximately 40 nm, for example a layer thickness of less than or equal to approximately 35 nm, for example a layer thickness of less than or equal to approximately 30 nm, for example a layer thickness of less than or equal to approximately 25 nm, for example a layer thickness of less than or equal to approximately 20 nm, for example a layer thickness of less than or equal to approximately 15 nm, for example a layer thickness of less than or equal to approximately 10 nm.

The second electrode 114 can generally be formed in a similar manner to the first electrode 110, or differently than the latter. In various embodiments, the second electrode 114 can be formed from one or more of the materials and with the respective layer thickness, as described above in connection with the first electrode 110. In various embodiments, both the first electrode 110 and the second electrode 114 are formed as translucent or transparent. Consequently, the light-emitting component 100 illustrated in FIG. 1 can be designed as a top and bottom emitter (to put it another way as a transparent light-emitting component 100).

The second electrode 114 can be formed as an anode, that is to say as a hole-injecting electrode, or as a cathode, that is to say as an electron-injecting electrode.

The second electrode 114 can have a second electrical terminal, to which a second electrical potential (which is different than the first electrical potential), provided by the energy source, can be applied. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

An encapsulation 108, for example in the form of a barrier thin-film layer/thin-film encapsulation 108, can optionally also be formed on or above the second electrode 114 and thus on or above the electrically active region 106.

In the context of this application, a "barrier thin-film layer" or a "barrier thin film" 108 can be understood to mean, for example, a layer or a layer structure which is suitable for forming a barrier against chemical impurities or atmospheric substances, in particular against water (moisture) and oxygen. In other words, the barrier thin-film layer 108 is formed in such a way that OLED-damaging substances such as water, oxygen or solvent cannot penetrate through it or at most very small proportions of said substances can penetrate through it.

In accordance with one configuration, the barrier thin-film layer 108 can be formed as an individual layer (to put it another way, as a single layer). In accordance with an alternative configuration, the barrier thin-film layer 108 may include a plurality of partial layers formed one on top of another. In other words, in accordance with one configuration, the barrier thin-film layer 108 can be formed as a layer stack. The barrier thin-film layer 108 or one or a plurality of partial layers of the barrier thin-film layer 108 can be formed for example by means of a suitable deposition method, e.g. by means of an atomic layer deposition (ALD) method in accordance with one configuration, e.g. a plasma enhanced atomic layer deposition (PEALD) method or a plasmaless atomic layer deposition (PLALD) method, or by means of a chemical vapor deposition (CVD) method in accordance with another configuration, e.g. a plasma enhanced chemical vapor deposition (PECVD) method or a plasmaless chemical vapor deposition (PLCVD) method, or alternatively by means of other suitable deposition methods.

By using an atomic layer deposition (ALD) method, it is possible for very thin layers to be deposited. In particular, layers having layer thicknesses in the atomic layer range can be deposited.

In accordance with one configuration, in the case of a barrier thin-film layer 108 having a plurality of partial layers, all the partial layers can be formed by means of an atomic layer deposition method. A layer sequence including only ALD layers can also be designated as a "nanolaminate".

In accordance with an alternative configuration, in the case of a barrier thin-film layer 108 including a plurality of partial layers, one or a plurality of partial layers of the barrier thin-film layer 108 can be deposited by means of a different deposition method than an atomic layer deposition method, for example by means of a vapor deposition method.

In accordance with one configuration, the barrier thin-film layer 108 can have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

In accordance with one configuration in which the barrier thin-film layer 108 includes a plurality of partial layers, all the partial layers can have the same layer thickness. In accordance with another configuration, the individual partial layers of the barrier thin-film layer 108 can have different layer thicknesses. In other words, at least one of the partial layers can have a different layer thickness than one or more other partial layers.

In accordance with one configuration, the barrier thin-film layer 108 or the individual partial layers of the barrier thin-film layer 108 can be formed as a translucent or transparent layer. In other words, the barrier thin-film layer 108 (or the individual partial layers of the barrier thin-film layer 108) can consist of a translucent or transparent material (or a material combination that is translucent or transparent).

In accordance with one configuration, the barrier thin-film layer 108 or (in the case of a layer stack having a plurality of partial layers) one or a plurality of the partial layers of the barrier thin-film layer 108 may include or consist of one of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. In various embodiments, the barrier thin-film layer 108 or (in the case of a layer stack having a plurality of partial layers) one or a plurality of the partial layers of the barrier thin-film layer 108 may include one or a plurality of high refractive index materials, to put it another way one or a plurality of materials having a high refractive index, for example having a refractive index of at least 2.

In various embodiments, on or above the encapsulation 108, it is possible to provide an adhesive and/or a protective lacquer 124, by means of which, for example, a cover 126 (for example a glass cover 126) is fixed, for example adhesively bonded, on the encapsulation 108. In various embodiments, the optically translucent layer composed of adhesive and/or protective lacquer 124 can have a layer thickness of greater than 1 μm, for example a layer thickness of several μm. In various embodiments, the adhesive may include or be a lamination adhesive.

In various embodiments, light-scattering particles can also be embedded into the layer of the adhesive (also designated as adhesive layer), which particles can lead to a further improvement in the color angle distortion and the coupling-out efficiency. In various embodiments, the light-scattering particles provided can be dielectric scattering particles, for example, such as metal oxides, for example, such as e.g. silicon oxide ($SiO_2$), zinc oxide (ZnO), zirconium oxide ($ZrO_2$), indium tin oxide (ITO) or indium zinc oxide (IZO), gallium oxide ($Ga_2O_a$), aluminum oxide, or titanium oxide. Other particles may also be suitable provided that they have a refractive index that is different than the effective refractive index of the matrix of the translucent layer structure, for example air bubbles, acrylate, or hollow glass beads. Furthermore, by way of example, metallic nanoparticles, metals such as gold, silver, iron nanoparticles, or the like can be provided as light-scattering particles.

In various embodiments, between the second electrode 114 and the layer composed of adhesive and/or protective lacquer 124, an electrically insulating layer (not shown) can also be applied, for example SiN, for example having a layer thickness in a range of approximately 300 nm to approximately 1.5 μm, for example having a layer thickness in a range of approximately 500 nm to approximately 1 μm, in order to protect electrically unstable materials, during a wet-chemical process for example.

In various embodiments, the adhesive can be designed in such a way that it itself has a refractive index which is less than the refractive index of the cover 126. Such an adhesive can be for example a low refractive index adhesive such as, for example, an acrylate which has a refractive index of approximately 1.3. Furthermore, a plurality of different adhesives forming an adhesive layer sequence can be provided.

Furthermore, it should be pointed out that, in various embodiments, an adhesive 124 can also be completely dispensed with, for example in embodiments in which the cover 126, for example composed of glass, is applied to the encapsulation 108 by means of plasma spraying, for example.

In various embodiments, the cover 126 and/or the adhesive 124 can have a refractive index (for example at a wavelength of 633 nm) of 1.55.

Furthermore, in various embodiments, one or a plurality of antireflective layers (for example combined with the encapsulation 108, for example the thin-film encapsulation 108) can additionally be provided in the light-emitting component 100.

Figure 2:
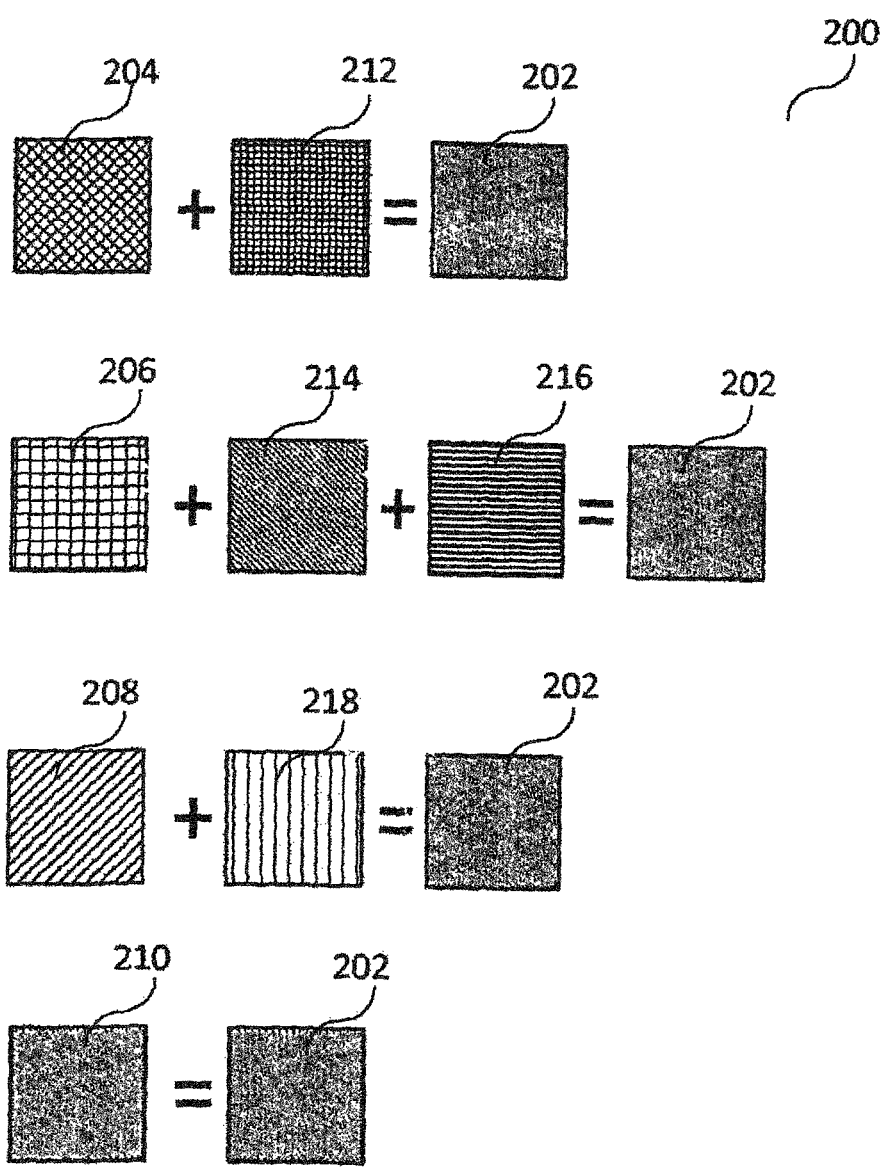
FIG. 2 shows a schematic illustration of an individualized bin adaptation, in accordance with various embodiments.

FIG. 2 shows a schematic illustration of an individualized bin adaptation 200, in accordance with various embodiments.

The illustration shows different initial states of optoelectronic components 100 having the optoelectronic properties 204, 206, 208, 210 during or after the manufacture of the optoelectronic components 100.

Optoelectronic properties can be, with regard to emitted or absorbed electromagnetic radiation, for example the intensity (brightness), the wavelength spectrum (color), the viewing angle dependence, the absorption or the efficiency of an optoelectronic component 100.

The individualized bin adaptation 200 can be understood as a selection method 200, for example a process matrix 200, in which, on the basis of initial states 204, 206, 208, 210 and one or a plurality of optoelectronic target property(-ies) 202, a selection is made with regard to adaptation processes 212, 214, 216, 218 or adaptation elements 212, 214, 216, 218, which can be used to set the target property(-ies) 202 in the optoelectronic components 100 having the optoelectronic properties 204, 206, 208, 210.

In this case, the number of possible initial states 204, 206, 208, 210 and adaptations 212, 214, 216, 218 is not limited to the number of possibilities illustrated. Rather, initial states 204, 206, 208, 210 and adaptations 212, 214, 216, 218 can differ discretely or even infinitesimally among one another and from one another.

The optoelectronic components 100 having different optoelectronic properties 204, 206, 208, 210 can have an identical or different design. An identical design can be understood to mean a planned layer cross section 100 of the component, i.e. identical number of layers, identical thickness of the layers and identical sequence of the layers.

By means of natural manufacturing fluctuation, however, in the case of an identical design, deviations of the optoelectronic properties of the optoelectronic components 100 among one another can occur, for example in terms of deviations of the thicknesses of individual layers for example in a range of approximately 0% to approximately 10%, for example in terms of the doping of semiconducting doped layers in a range of approximately 0% to approximately 10%.

The optoelectronic components 100 having different optoelectronic properties 204, 206, 208, 210 can, in a targeted manner, be compensated for or adapted to a common optoelectronic property 202, i.e. set to a common target property 202. An adaptation or a compensation of the initial state can be dispensed with if the initial state 204, 206, 208, 210 corresponds to the target state 202, for example in the component having the properties 210.

In the components having deviating properties 204, 206, 208, different adaptations 212, 214, 216, 218 for setting the target property 202 can be performed depending on the individual optoelectronic properties 204, 206, 208.

In one configuration, processing the optoelectronic properties of at least two components 100 can concern different optoelectronic properties, for example 204 and 208 the color, 206 the color and the brightness.

In another configuration, the same adaptation element can change the optoelectronic properties differently in two optoelectronic components of the same design, i.e. the effect of the adaptation element can be a different effect depending on the specific configuration of a component. By way of example, the optical thickness of the component can vary by means of the adaptation element. Depending on the specific configuration of the layer thicknesses of the components of identical design, minimal differences in the optical thickness can occur, for example by a few 10 nm. As a result, the formation of destructive interference at the interface that couples out radiation can occur in some components. In some components, the adaptation measure can then have no significant influence on the color or brightness of one component and, in another component of identical design, can lead to extinction of a wavelength in the emission spectrum of the optoelectronic component.

In another configuration, the optoelectronic properties can also be manifested differently, however, i.e. the absolute value of the measured value that quantifies the optoelectronic property can differ.

In one configuration, depending on individual initial properties 204, 206, 208, the adaptation can require one adaptation measure 212, 218 or two or more adaptation measures successively 214, 216.

In one configuration, an individual adaptation measure, for example 214, can change a plurality of optoelectronic properties simultaneously, for example the brightness and the color.

In one configuration, the simultaneous change of two or more optoelectronic properties can lead to an improvement of at least one optoelectronic property. Improving an optoelectronic property can be understood to mean approximating the optoelectronic properties to the target property, for example changing the color or color mixture, i.e. the wavelength spectrum, of the emitted light of the component 100 toward the target property, for example from green light to white light. Changing the color can be formed for example by means of wavelength conversion, for example by means of a layer including phosphor with Stokes shift; or by means of increasing the proportion of coupled-out light with the target property by means of changing wavelength-dependent conditions of interference or total internal reflection by means of applying a layer composed of high refractive index glass.

In another configuration, further adaptation measures, for example 216, can improve identical or different optoelectronic properties, for example the viewing angle dependence, for example with a scattering layer, or can improve or compensate for an optoelectronic property impaired or improved too little by means of previous adaptation measures, for example the brightness. By way of example, by means of 214, the color of the light, i.e. the wavelength of the light, can be changed toward the target property, but the coupling-out, i.e. the brightness, can decrease in this case. The further adaptation 216 can then increase the brightness, i.e. the intensity of the electromagnetic radiation, for example by means of applying a scattering layer or canceling destructive interference at the interface that couples out light, or reducing total internal reflection.

In another configuration, the adaptation of the optoelectronic properties toward the target properties can be achieved in the sum of the adaptation measures, i.e. an individual adaptation measure per se need not already change an optoelectronic property toward the respective target property. It is also possible for the target property to be set only in context with other adaptation measures; by way of example, the color of the component 100 having the properties 206 can have a wavelength 50 nm below the target wavelength and the adaptations 214, 216 shift the wavelength by 25 nm in each case on the basis of the constitution of the adaptations 214 and 216, respectively.

In another configuration, the adaptation elements implemented successively, for example 214, 216, can be identical in this case, for example have an identical substance composition, an identical layer cross section, identical layer thicknesses; or can be formed differently, for example different substance compositions, different layer cross sections, different layer thicknesses; or can differ or correspond in terms of one or more properties, for example identical substance composition, different layer cross sections, different layer thicknesses.

In another configuration, the adaptation processes can be different, for example in terms of the process parameters, for example temperature, power of a microwave generator in a plasma treatment, or the parameters of the compensation elements, for example of compensation layers, for example the substance composition, the number of layers that differ in terms of substance, the sequence of layers that differ in terms of substance, the thickness of individual layers and their interface structuring, for example surface roughness.

In another configuration, the adaptations 212, 214, 216, 218 of the initial states 204, 206, 208 can be formed differently, for example by means of applying a layer to the optoelectronic component, for example wet-chemical application, for example screen printing, vapor deposition, spraying, deposition, or by means of applying a compensation film or by means of chemical or physical treatment of the surface of the optoelectronic component 100, for example of the protective lacquer 124, for example etching, polishing, polymerizing, i.e. chemical crosslinking by means of ring opening reactions or opening multiple bonds.

In another configuration, different or identical compensation measures can be combined with one another, for example applying a compensation layer and applying a compensation film, for example applying adhesive and a film, for example adhesively bonding a film, wherein both compensation elements have a planned optical effect.

The adaptation measures 212, 214, 216, 218 specific to the respective optoelectronic properties 204, 206, 208 are dependent on the specific configuration of the optoelectronic component 100, for example the refractive indices of the substances used or the thickness of individual layers, for example the optical thickness of the individual layers and the absorption in the individual layers.

Figure 3:
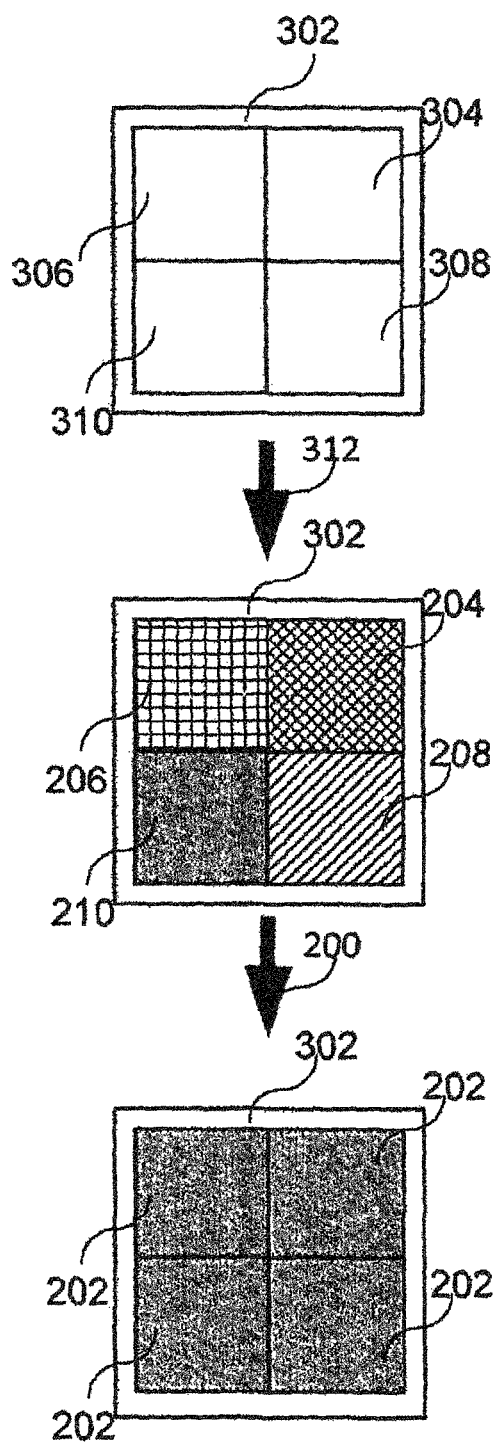
FIG. 3 shows a schematic illustration of a method for individualized bin adaptation, in accordance with various embodiments.

FIG. 3 shows a schematic illustration of a method for individualized bin adaptation 200, in accordance with various embodiments.

The illustration shows a first optoelectronic component 304, a second optoelectronic component 306, a third optoelectronic component 308 and a fourth optoelectronic component 310 of the same design 100 having initially unknown optoelectronic properties on a common system carrier 302. The system carrier 302 can be for example a substrate 102 common to the components 304, 306, 308, 310, for example before the singulation of the optoelectronic components 304, 306, 308, 310.

The substrate 102 or the system carrier 302 can be formed mechanically flexibly, for example as a film composed of plastic, aluminum, copper or steel, for example for roll-to-roll methods; or can be formed mechanically stiffly, for example as a wafer composed of glass, plastic or silicon.

After or during the manufacture of the optoelectronic components, the optoelectronic properties 204, 206, 208, 210 of the optoelectronic components 304, 306, 308, 310 can be measured by means of a measuring unit (symbolized by means of an arrow 312 in FIG. 3).

Measuring 312 can be carried out for example after applying the second electrode 114 and/or after applying the encapsulation 108 and/or after applying the protective lacquer 124 and/or after applying the glass cover 126.

Measuring 312 can involve determining an individual measurement parameter or a plurality of measurement parameters simultaneously or successively, for example the wavelength spectrum of emitted electromagnetic radiation (color) and the brightness, for example by means of a photodetector after an operating voltage has been applied to the component.

Identical or different measurement parameters can be measured multiply or after different manufacturing steps, for example measuring the color after applying the encapsulation 108 and after applying the protective lacquer 124; for example measuring the color after applying the encapsulation 108 and measuring the brightness after applying the glass cover 126.

After measuring 312 the optoelectronic properties 204, 206, 208, 210 of the optoelectronic components 304, 306, 308, 310, on the basis of the specific layer cross section of the optoelectronic component 100, the specific adaptation measures 200 can be determined and the optoelectronic components 304, 306, 308, 310 can be set to the common target property 202.

Selecting specific adaptation measures, for example 212, 214, 216, 218, can be realized by means of connecting the measuring unit(s) 508 to a selection unit 512, which has a process matrix 200, automatically, for example electronically, for example in a computer-aided manner.

The selected adaptation measure processes the optoelectronic component in such a way that the deviation with respect to the target properties (generally one or more predefined target properties) is the least, relative to the non-selected alternative adaptation measures. In this case, one from at least two adaptation measures is selected. The selection criterion can be based on experimental experience and take account of economic aspects.

For applying adaptation elements, in accordance with the process matrix 200 it is possible to provide the substances necessary for the adaptations, for example compensation films, for example different film classes, for example with different coatings.

Figure 4:
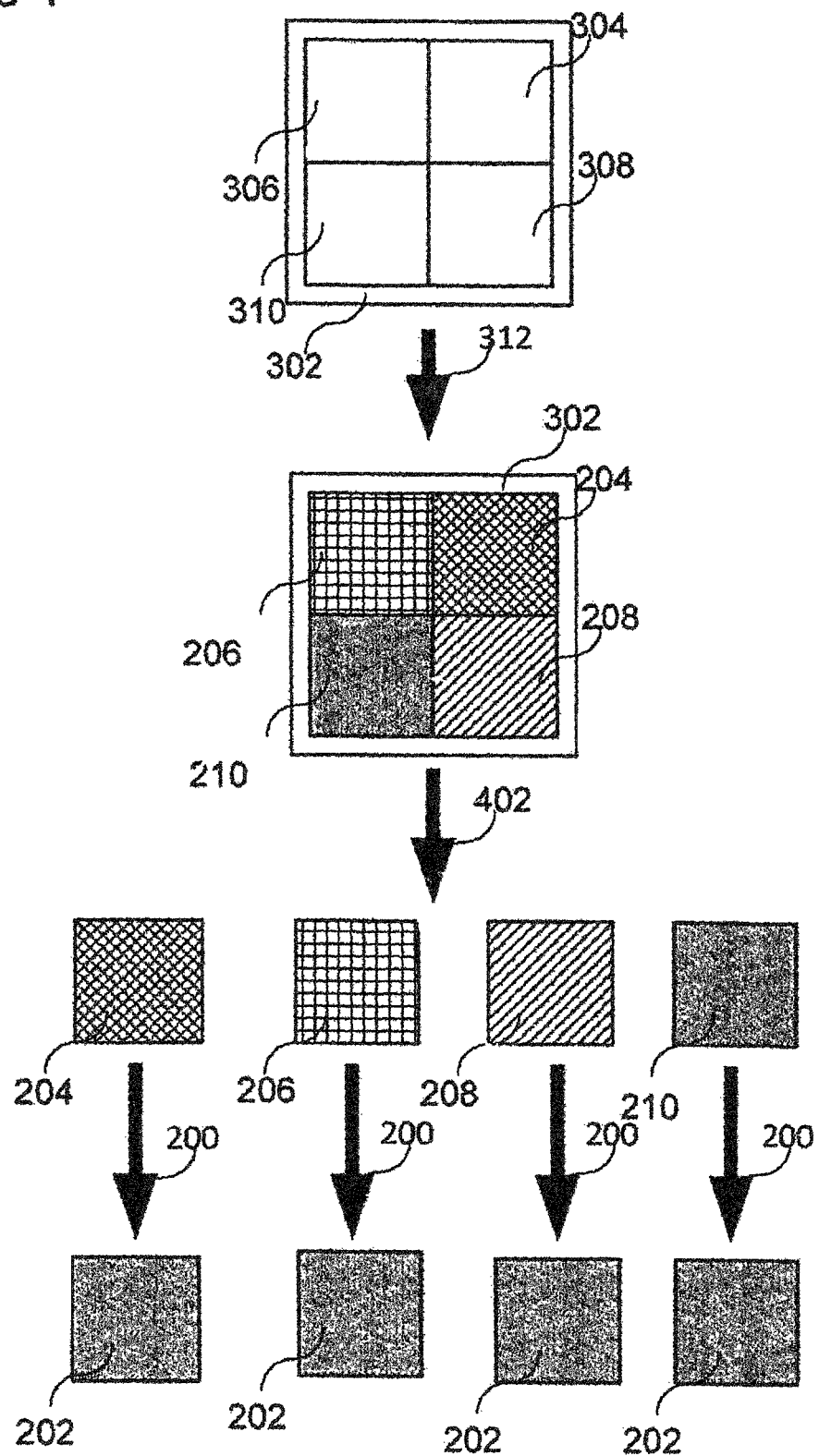
FIG. 4 shows a schematic illustration of a method for individualized bin adaptation, in accordance with various embodiments.

FIG. 4 shows a schematic illustration of a method for individualized bin adaptation, in accordance with various embodiments.

Measuring 212 the optoelectronic properties 204, 206, 208, 210 of the optoelectronic components 304, 306, 308, 310 can be carried out on a common system carrier 302 in accordance with FIG. 3. However, adapting the optoelectronic properties 204, 206, 208, 210 toward the target property 202 can also be carried out after singulating 402 the optoelectronic components 304, 306, 308, 310 having the optoelectronic properties 204, 206, 208, 210.

Measuring 312 the optoelectronic properties 204, 206, 208, 210 and compensation or processing 200 to the target property 202 can also be carried out only after singulation 402. Compensation or processing 200 of the optoelectronic properties 204, 206, 208, 210 to the target property 202 can be part of front-end production (before the singulation of the components) or back-end production (after the singulation of the components) of the optoelectronic component 100.

Figure 5:
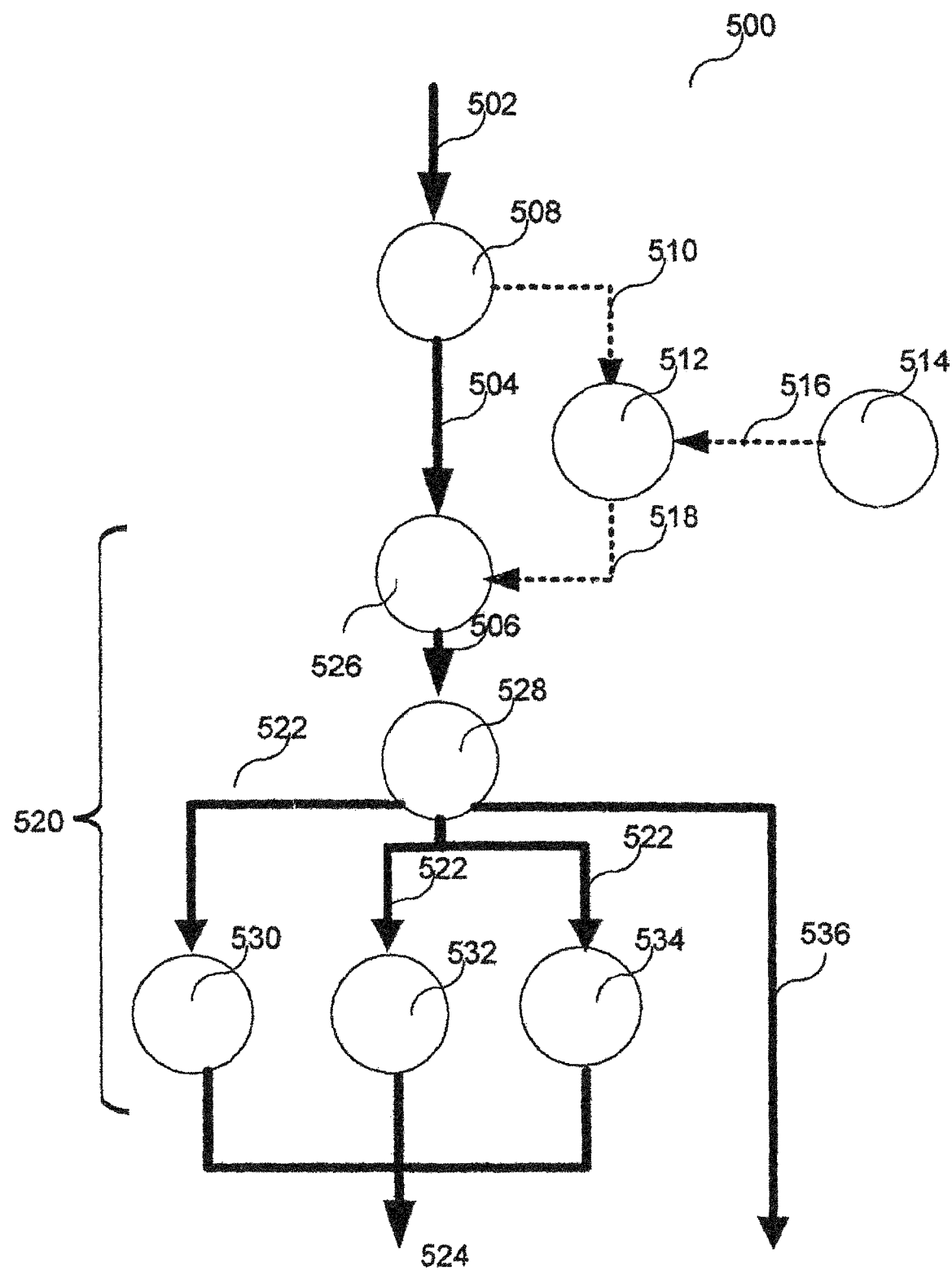
FIG. 5 shows a schematic illustration of a device for individualized bin adaptation, in accordance with various embodiments.

FIG. 5 shows a schematic illustration of a device 500 for individual bin adaptation 200.

A plurality of optoelectronic components 304, 306, 308, 310 can be transported into the device 500 by means of a transport device 502 after or during the manufacture of the optoelectronic components.

The transport 502 of the components 100 can be formed on a system carrier 302 or after singulation 402.

One or a plurality of optoelectronic properties 204, 206, 208, 210 of the components 304, 306, 308, 310 can be determined (312) in the measuring unit 508.

The measuring unit 508 can communicate an information transport 510 of the optoelectronic properties, i.e. of the at least one measurement parameter, to the selection unit 512.

The optoelectronic properties of the target bin 202, for example in the form of an emission spectrum, and the constitution of the components 304, 306, 308, 310, i.e. the manufacturing status, can be set or input in an input unit 514.

The manufacturing status can be, for example, information regarding what layer was last applied on the component 100, for example last applied layer is second electrode 114.

The target bin 202 and the manufacturing status can be communicated to the selection unit 512 by means of information transport 516.

In the selection unit 512, the compensation measures 212, 214, 216, 218 required for the components 304, 306, 308, 310, i.e. the compensation elements 212, 214, 216, 218 and/or compensation processes 212, 214, 216, 218, can be determined by means of the process matrix 200 and the information from the measuring unit 508 and the input unit 514.

By way of example, determining the required compensation measures 212, 214, 216, 218 can be realized by means of coordinating the measured spectrum with the target spectrum, wherein the differences between the spectra are compared with the optoelectronic effect of known compensation measures.

Besides the compensation process to be carried out or compensation layers and/or compensation films to be applied, the compensation measures 212, 214, 216, 218 can include further information or process specifications, for example firstly singulate 402 components 304, 306, 308, 310 or apply adhesion layer, for example adhesive, to component surface, then apply compensation film, or for example what substances are to be kept available in what quantity.

After determining the compensation measures 212, 214, 216, 218 in the selection unit 512, an information flow 518 can communicate the compensation measures 212, 214, 216, 218 to the compensation unit 520.

Besides the information flow 518 to the compensation unit 520, the device 500 may include transport 504 of the components 304, 306, 308, 310 from the measuring unit 508 into the compensation unit 520.

In the compensation unit 520, the components 304, 306, 308, 310 can firstly be singulated (402) in a singulation unit 526, if the components 304, 306, 308, 310 have a common system carrier 302 and singulation 402 is necessary for performing the compensation measures.

Singulation 402 may be necessary, for example, if multi-stage adaptation measures are intended to be formed for some components and not for others, for example compensation measures 214, 216.

A further reason for singulating 402 the components may be incompatible compensation measures 212, 214, 216, 218, for example applying an adhesive layer 214, and subsequently applying a compensation film 216 as a multi-stage compensation measure may be incompatible, for example, with the compensation measure of applying a scattering layer 212 and separate compensation 200 of the components 304, 306 having the properties 204, 206 may therefore be necessary.

The compensation element 520 can furthermore include singulating 402 the components 304, 306, 308, 310 if optoelectronic components, for example the component 310, have optoelectronic properties 210 which already correspond to the target properties 202 and, consequently, no compensation measure are necessary.

Furthermore, the selection unit 512 can determine on the basis of the process matrix 200 whether the components 304, 306, 308, 310 should be singulated and/or form logical groups, i.e. for which components identical or similar compensation measures are formed and can therefore be processed together.

However, the singulation unit can be optional, for example since components have already been singulated before being transported (502) into the device 500 or singulation 402 of the components 100 is not possible or not provided, for example in the case of a plurality of planar and/or coupled optoelectronic components, for example with a film as common system carrier in roll-to-roll methods.

In the singulation unit 528, the components 304, 306, 308, 310 can be marked with their individual compensation measures 212, 214, 216, 218 in accordance with the process matrix 200, for example electronically, for example on a transport carrier or slide on which the components are transported within the compensation unit 520, or optically for example by means of barcodes, on an edge region of the component which does not fulfill an optoelectronic task.

From the singulation unit 526 or from the measuring unit 508, the optoelectronic components 304, 306, 308, 310 can be transported 506 into the identification-sorting device 528.

Without a singulation unit 526 or singulation 402, it is possible to form the information flow 518 and the transport 504 of the components directly into the identification-sorting unit 528. Furthermore, without a singulation unit 526, it is possible to form the individual marking of the components 304, 306, 308, 310 with their compensation measures 212, 214, 216, 218 in the identification-sorting unit 528.

In the identification-sorting unit 528, singulated components 304, 306, 308, 310 are identified by means of their markings and transported (522) to the compensation units 530, 532, 534 in accordance with their compensation measures 212, 214, 216, 218, or, if the optoelectronic properties 210 already correspond to the target bin 202, the component 310 are transported (536) from the device 500, i.e. the compensation measures are concluded.

For non-singulated components, the identification-sorting unit can set, i.e. trigger, the beginning of compensation measures for a component.

One compensation installation 530 can be a unit for applying compensation layers, for example adhesive layer, scattering layer, coupling layer, waveguide layer, for example a chemical and/or physical vapor deposition installation (chemical vapor deposition, physical vapor deposition, sputtering), a spray coater (spray coating), a dip coater (dip coating), a spin coater (spin coating), a squeegee (screen printing) or similar, conventional method installations. On the basis of the individual marking, in the compensation installation 530 for compensation layers depending on the individual optoelectronic properties of the components in accordance with the process matrix 200 and predefinition of the selection unit 512, it is possible to set individual coating methods and/or substances and/or substance mixtures and/or process parameters, for example temperature, air humidity, pressure, solvents, solution concentration, layer thicknesses, drying times, or similar, conventional parameters.

A compensation installation 532 can be formed as a unit for applying a compensation film, for example a film for increasing the optical thickness of the optoelectronic component, a film having a scattering effect, a film having a wavelength-converting effect, for example by means of lamination.

A compensation installation 534 can be a unit for a compensation process, for example smoothing, for example chemical mechanical polishing; etching, for example wet-chemically by means of acids or physically by means of plasma, structuring, doping, plasma treatment of the exposed surface of the component, polymerizing, degrading or similar, conventional methods for the treatment of surface properties.

In one configuration, the device 500 can be part of a conventional manufacturing installation for optoelectronic components 100 and the thickness of the adhesive layer 124 and/or the constitution of the cover glass 126 and/or the surface roughness of, for example, the thin-film encapsulation 108 or second electrode 114 can be set by means of the device 500.

The incipiently roughened surface of the thin-film encapsulation 108 or of the second electrode 114 can act as a scattering layer and simultaneously act for increasing the adhesion of the adhesive layer 124. The adhesive layer 124 and the cover glass 126, depending on their specific thickness, by means of increasing the optical thickness of the component, can shift interference conditions and thus change the color and/or brightness. For a specific configuration of a component 100, the device 500 can adapt values, for example the layer thickness of the adhesive layer 124, the process condition thereof and the surface roughness of the thin-film encapsulation 108 or second electrode 114, dynamically to the specific component in order to optimize the optoelectronic properties.

The compensation installations 530, 532, 534 may include individual installations, for example an individual vapor deposition installation, or a series of installations, for example when laminating films, including an installation for applying adhesive and an installation for applying lamination film.

The device 500 may include a further transport device 524 for the components from the compensation units 530, 532, 534.

The components can be transported (524) from the device if the optoelectronic properties of the components correspond to the target bin (see FIG. 3 and FIG. 4), for example in order to apply the encapsulation 124, 126 or for example into back-end manufacturing, i.e. 524 corresponds to 536.

However, the optoelectronic components can also pass through the device again, for example in order to set further optoelectronic properties, for example the brightness after the color has been set. For this purpose, a plurality of devices 500 can be disposed in series or the target bin 202 and/or the manufacturing status of the components can be changed manually or by means of a machine program in the input unit 514. The transport 524, 536 can then be transport 502 to a measuring unit 508.

Further reasons for the components to pass through the device 500 again after leaving the compensation installations 530, 532, 534, 536 may include checking the optoelectronic properties, i.e. the compensation measures can be verified, i.e. 524, 536 can correspond to 502.

In the case of multi-stage compensation measures, for example 214, 216, passing through again can involve carrying out further compensation measures 216 after the conclusion of the previous measure 214, i.e. 524 can correspond to 502, 504, 506 or 522. In the case of passing through the device 500 in a multi-stage process, i.e. if the multi-stage (214, 216) compensation measures are not formed in one compensation installation, an information flow to the identification-sorting unit 528 from the compensation installations 530, 532, 534 and/or an information memory in the identification-sorting unit 528 may be necessary, which updates the status of the compensation measure and coordinates the next compensation measures.

A plurality of the transport devices 502, 504, 506, 522, 524, 536 can be formed as a common transport device, for example a gripping arm or a conveyor belt. A plurality of the units 508, 526, 528, 530, 532, 534 can also be formed as individual assemblies of a compact device, such that transport 504, 506, 522, 530, 532, 534 between the units is not necessary. Moreover, it is not necessary to form different or a plurality of compensation units 530, 532, 534 in the device. Compensation layers can already be prepared on films, for example. Therefore, it is also possible exclusively to apply compensation films to the components, wherein a plurality of film classes are provided and are applied to the components in accordance with the process matrix 200.

Figure 6:
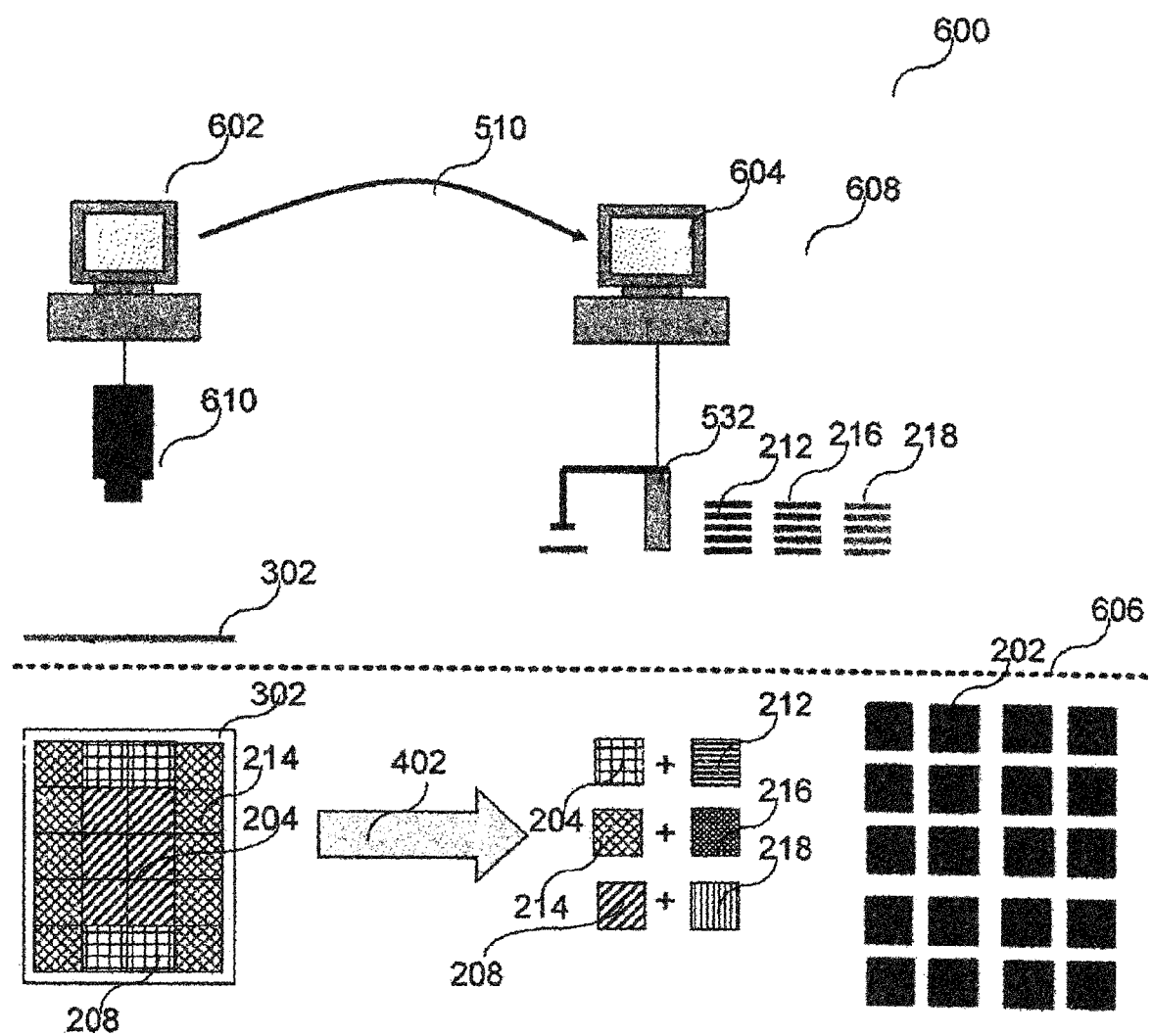
FIG. 6 shows a schematic illustration of a first specific configuration of the device.

FIG. 6 shows a schematic illustration of a first specific configuration 600 of the device 500.

The illustration shows a side view (upper half) and a plan view (lower half) of the device in accordance with a first specific configuration 600—separated by means of the auxiliary line 606.

The illustration shows a measuring unit 602 with camera 610, which measures optoelectronic components 304, 306, 308 (not visible) having different optoelectronic properties 204, 214, 208 on a common system carrier 302. The measured values are communicated 510 electronically to an automated lamination station 608. The automated lamination station 608 has a computer 604, which realizes the input unit 514 and selection unit 512 with process matrix 200. By means of a gripping unit 532, individual compensation films 212, 216, 218 with adapted color additives are applied, in accordance with the process matrix 200, to the components after the singulation 402 thereof. A multiplicity of optoelectronic components having an identical color bin 202 can be realized as a result.

The measurement of the color information can be carried out during the manufacture (inline measurement) of the optoelectronic components prior to singulation (front-end), while the application or the lamination of the compensation films 212, 216, 218 can be carried out after the singulation of the optoelectronic components (back-end).

Figure 7:
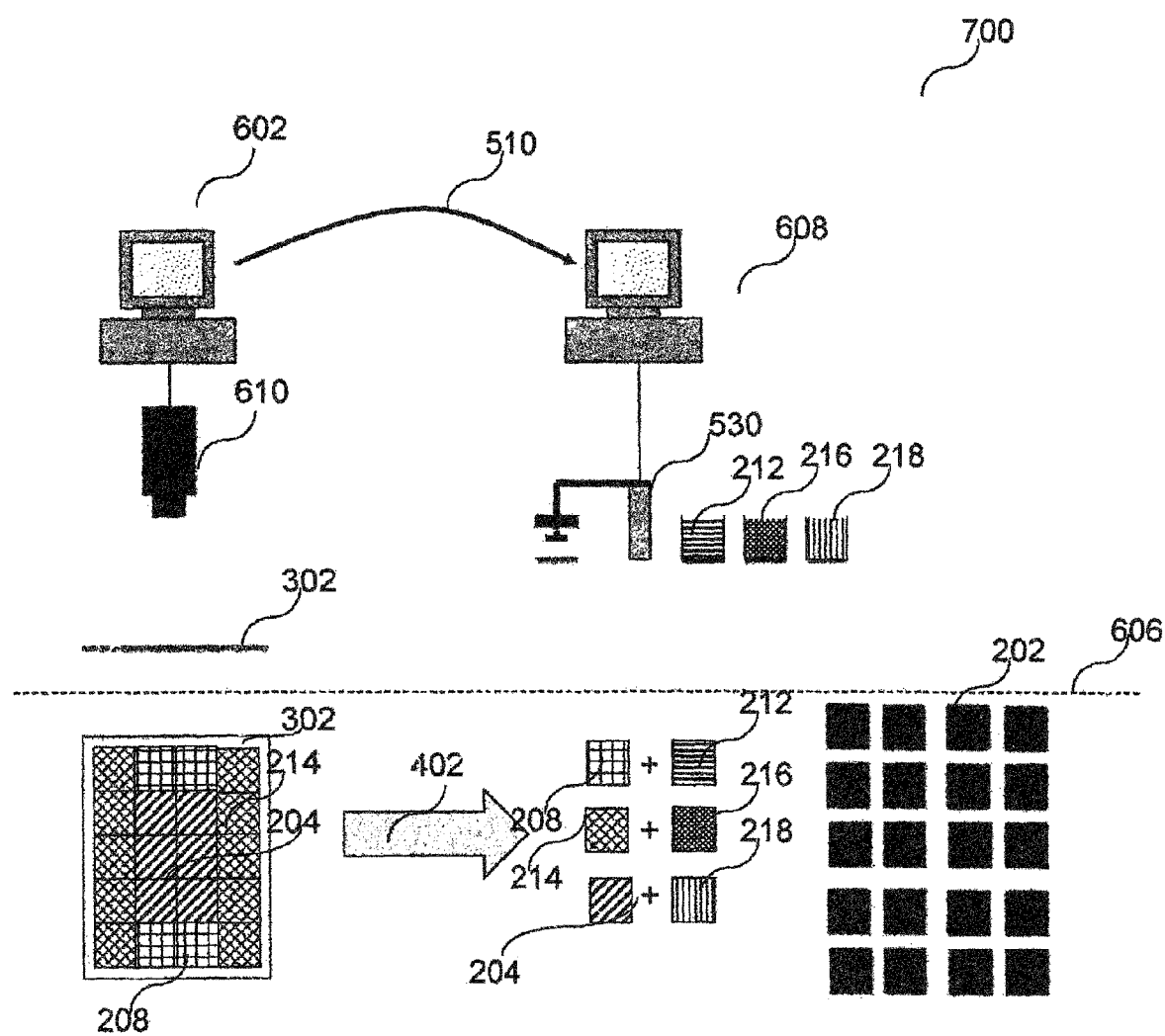
FIG. 7 shows a schematic illustration of a second specific configuration of the device.

FIG. 7 shows a schematic illustration of a second specific configuration 700 of the device 500.

The illustration shows a side view (upper half) and a plan view (lower half) of the device in accordance with a second specific configuration 700—separated by means of the auxiliary line 606.

The second configuration 700 differs from the first configuration 600 in terms of the compensation unit 608 in such a way that, in the case of the second configuration 700, compensation layers 212, 216, 218 are applied to the singulated components having the properties 204, 206, 214 by means of a pad printing installation 530 of films with adapted color additives.

Figure 8:
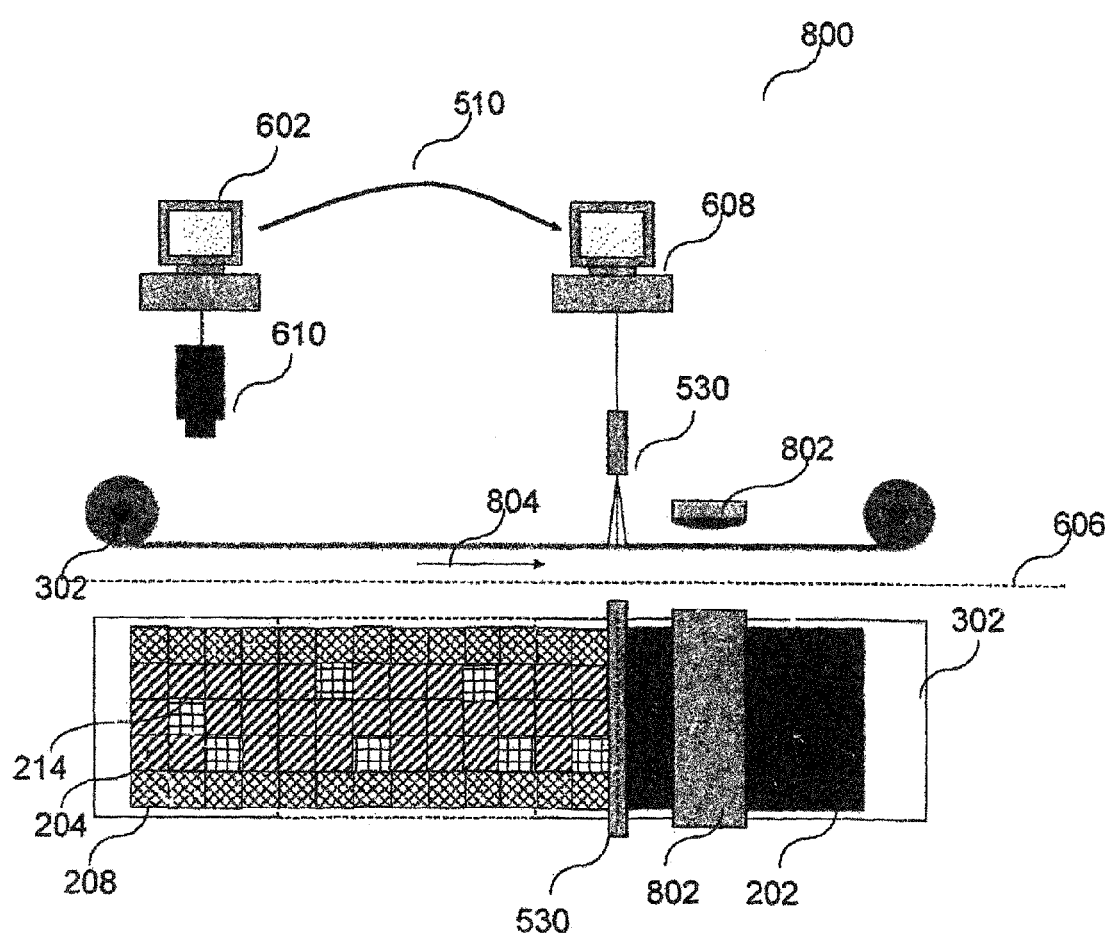
FIG. 8 shows a schematic illustration of a third specific configuration of the device.

FIG. 8 shows a schematic illustration of a third specific configuration 800 of the device 500.

The illustration shows a side view (upper half) and a plan view (lower half) of the device in accordance with a third specific configuration 800—separated by means of the auxiliary line 606.

The third specific configuration 800 differs from the first configuration 600 and the second configuration 700 in such a way that the optoelectronic components having different color bins 204, 214, 208 are formed before and after the adaptation on a roll 302 and are not singulated. The application of the compensation layers 212, 216, 218 with color additives can be applied to the components by means of a selective spraying station 530. The compensation layers 212, 216, 218 (not visible) can be dried after application by means of a drying station 802.

The transport 502, 504, 506, 522, 524 through the device is carried out on a roll 302, i.e. the system carrier, by means of a roll-to-roll method 804.

In various embodiments, a method and a device for producing a plurality of optoelectronic components are provided, with which it is possible to adapt optoelectronic components having different optoelectronic properties toward a common optoelectronic target property. As a result, it is possible to reduce the manufacturing variation, i.e. the color and brightness variation, during the production of the optoelectronic components. Thus, manufacturing can be controlled better and customer requests for specific color or brightness bins can be handled directly without relatively high overproduction.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A method for producing a plurality of optoelectronic components, the method comprising:

measuring at least one measurement parameter for a first optoelectronic component and a second optoelectronic component; and processing the first optoelectronic component and the second optoelectronic component taking account of the measured measurement parameter value of the first optoelectronic component and the measured measurement parameter value of the second optoelectronic component, such that the optoelectronic properties of the first optoelectronic component and the optoelectronic properties of the second optoelectronic component are changed in a different way toward at least one common predefined optoelectronic target property;

wherein the processing of at least one value of a measurement parameter of the optoelectronic properties of the first optoelectronic component or of the optoelectronic properties of the second optoelectronic component toward the optoelectronic target property is formed by means of a compensation element; and wherein the compensation element is formed as a film.

2. The method as claimed in claim 1,
wherein the measurable parameter comprises a measurement parameter with regard to emitted or absorbed electromagnetic radiation from the group of the measurement parameters:
the brightness or the intensity;
the wavelength spectrum or the color;
the viewing angle dependence;
the absorption; or
the efficiency.

3. The method as claimed in claim 1,
wherein the optoelectronic properties of the first optoelectronic component and the optoelectronic properties of the second optoelectronic component deviate from the optoelectronic target property in terms of the same optoelectronic property.

4. The method as claimed in claim 1,
wherein measuring the measurement parameter comprises measuring the optoelectronic properties after or during the manufacture of the optoelectronic component.

5. The method as claimed in claim 1,
wherein the film comprises at least one coating, wherein the coating is a compensating coating and the film is a carrier of the coating.

6. The method as claimed in claim 1,
wherein the optoelectronic properties of the first optoelectronic component or of the second optoelectronic component are processed in combination from two or more compensation elements toward the target property.

7. The method as claimed in claim 1,
wherein further optical layers are formed between the optoelectronic component and the compensation element.

8. The method as claimed in claim 7,
wherein the further layers are formed in such a way that the further layers have an adhesion-reinforcing, diffusion-inhibiting and/or optically coupling effect.

9. The method as claimed in claim 5,
wherein the two or more compensation elements comprise layers having an identical or different layer cross section, wherein a layer cross section comprises the following properties:
the layer sequence;
the number of layers;
the layer thickness;
the substance composition of the layers.

10. The method as claimed in claim 5,
wherein at least one different compensation element is applied to the first optoelectronic component in comparison with the second optoelectronic component.

11. The method as claimed in claim 1,
wherein the optoelectronic component is formed as a radiation-emitting component.

12. The method as claimed in claim 1,
wherein the optoelectronic component is formed as a radiation-detecting component.

13. A device for producing a plurality of optoelectronic components, the device comprising:
an input unit, designed for inputting at least one common optoelectronic target property of the plurality of optoelectronic components;
a measuring unit, designed for measuring at least one optoelectronic property of the optoelectronic components and for communicating the same to a selection unit;
a compensation unit, designed for providing at least two compensation elements having different optoelectronic effects with regard to the common target property for the optoelectronic components for selection by means of a selection unit;
the selection unit, designed for component-individually selecting at least one compensation element using the measured at least one optoelectronic properties of the optoelectronic components and the optoelectronic effect for the optoelectronic components in such a way that after the use of the at least one selected compensation element and/or of the at least one selected compensation method, the optoelectronic properties of the optoelectronic components are changed toward the target property.

14. The device as claimed in claim 13,
wherein the input unit is designed for inputting the manufacturing status of the optoelectronic components.

15. The method as claimed in claim 11,
wherein the optoelectronic component is formed as an organic light-emitting diode.

* * * * *